United States Patent [19]

Kanno

[11] Patent Number: 5,381,047

[45] Date of Patent: Jan. 10, 1995

[54] SEMICONDUCTOR INTEGRATED CIRCUIT HAVING MULTIPLE SILICON CHIPS

[76] Inventor: Kazumasa Kanno, 991, Kuno Sowamachi, Sashima-Gun, Ibaraki Ken 306-02, Japan

[21] Appl. No.: 63,911

[22] Filed: May 20, 1993

[30] Foreign Application Priority Data

May 27, 1992 [JP] Japan ................... 4-042215

[51] Int. Cl.[6] ............... H01L 25/08; H01L 23/12; H01L 23/32
[52] U.S. Cl. .................... 257/777; 257/783; 257/618; 257/700; 257/622; 257/725; 361/804; 361/759; 361/803
[58] Field of Search ............. 257/777, 686, 782, 783, 257/618, 678, 622, 700, 723, 725, 702; 361/740, 742, 747, 759, 790, 804

[56] References Cited

U.S. PATENT DOCUMENTS

| 4,984,066 | 1/1991 | Iversen | 257/714 |
| 4,998,665 | 3/1991 | Hayashi | 257/777 |
| 5,006,920 | 4/1991 | Schafer et al. | 257/706 |

FOREIGN PATENT DOCUMENTS

| 1-28856 | 1/1989 | Japan | 257/686 |
| 1-57760 | 3/1989 | Japan | 257/782 |
| 1-189148 | 7/1989 | Japan | 257/782 |
| 1-235363 | 9/1989 | Japan | 257/783 |
| 4-253348 | 9/1992 | Japan | 257/783 |

OTHER PUBLICATIONS

Japanese Gazette of Japanese Patent Publication No. HEI3-245462, dated Nov. 1, 1991.

*Primary Examiner*—Andrew J. James
*Assistant Examiner*—John F. Guay
*Attorney, Agent, or Firm*—Armstrong, Westerman, Hattori, McLeland & Naughton

[57] ABSTRACT

A semiconductor integrated circuit of the laminated type having a large circuit capacity includes an upper silicon tip and a lower silicon tip as essential components and a layer of electrical insulative material is interposed between the upper silicon tip and the lower silicon tip both of which are electrically connected to each other via a number of lead wires extending therebetween. An assembly of the upper silicon tip, the electrical insulative material layer and the lower silicon tip is fixedly mounted on a base board, and the foregoing assembly is then covered with a cap. To prevent the upper silicon tip and the lower silicon tip from being undesirably dislocated from their original locations, at least one first projection is projected downward of the lower surface of the upper silicon tip and a first fitting groove adapted to receive the first projection therein is recessed from the upper surface of the electrical insulative material layer, while at least one second projection is projected upward of the upper surface of the lower silicon tip and a second fitting groove adapted to receive the second projection therein is recessed from the lower surface of the electrical insulative material layer. The upper silicon tip is dimensioned to have a length less than that of the electrical insulative material layer, the electrical insulative material layer is dimensioned to have a length less than that of the lower silicon tip, and the lower silicon tip is dimensioned to have a length less than that of the base board.

5 Claims, 2 Drawing Sheets

SEMICONDUCTOR INTEGRATED CIRCUIT HAVING MULTIPLE SILICON CHIPS

BACKGROUND OF THE INVENTION

1. Field of the Invention

The present invention relates generally to a semiconductor integrated circuit. More particularly, the present invention relates to improvement of the structure of a semiconductor integrated circuit of the laminated type.

2. Description of the Related Art

A conventional semiconductor integrated circuit is generally constructed such that a single semiconductor is produced using a single silicon chip. Since the modern semiconductor technology is limitatively employed for forming a pattern on a silicon chip by irradiating electron beam, X-rays or the like, it is practically difficult to produce a semiconductor integrated circuit in excess of a level of ultra-large scale integrated circuit based on the modern semiconductor technology.

As is well known for any expert in the art, a variety of development works have been currently conducted to producing a semiconductor integrated circuit in the three-dimensional configuration but this technical concept of producing a semiconductor integrated circuit in the three-dimensional configuration can not be employed for a mass production system. Since a number of semiconductor integrated circuits can be subjected to soldering at a time on the assumption that the foregoing technical concept is practically realized on the mass production basis, any type of conventional soldering device can be employed as it is. This leads to the result that the foregoing technical concept can be applied to a mass production system without any particular problem. However, there is left unsolved a problem that the conventional semiconductor integrated circuit has a small circuit capacity because it is produced using a single silicon chip corresponding to a single semiconductor integrated circuit.

SUMMARY OF THE INVENTION

The present invention has been made in consideration of the aforementioned background.

An object of the present invention is to provide a semiconductor integrated circuit of the laminated type which has a large circuit capacity compared with the conventional semiconductor integrated circuit.

Another object of the present invention is to provide a semiconductor integrated circuit of the laminated type of which circuit capacity is larger than that of the super-large scale integrated circuit which has been currently developed.

The present invention provides a semiconductor circuit of the laminated type which is constructed such that a layer of electrical insulative material is interposed between an upper silicon chip and a lower silicon chip, and the upper silicon chip and the lower silicon chip are electrically connected to each other via a number of lead wires extending therebetween.

An assembly of the upper silicon chip, the electrical insulative material layer and the lower silicon chip is fixedly mounted on a base board, and the foregoing assembly is then covered with a cap.

To prevent the upper silicon chip and the lower silicon chip from being undesirably dislocated from their original positions, at least one first projection having a predetermined sectional shape is projected downward of the lower surface of the upper silicon chip and a first fitting groove having the same sectional shape as that the first projection and adapted to receive the first projection therein is recessed from the upper surface of the electrical insulative material layer, while at least one second projection having a predetermined sectional shape is projected upward of the upper surface of the lower silicon chip and a second fitting groove having the same sectional shape as that of the second projection and adapted to receive the second projection therein is recessed from the lower surface of the electrical insulative material layer.

Otherwise, at least one first fitting groove having a predetermined sectional shape is recessed from the lower surface of the upper silicon chip and a first projection having the same sectional shape as that of the first fitting groove and adapted to be fitted into the first fitting groove is projected upward of the upper surface of the electrical insulative material layer, while at least one second fitting groove having a predetermined sectional shape is recessed from the upper surface of the lower silicon chip and a second projection having the same sectional shape as that of the second fitting groove and adapted to be fitted into the second fitting groove is projected downward of the lower surface of the electrical insulative material layer.

The upper silicon chip is electrically connected to a number of bonding pads which are electrically connected to the lead wires.

To assure that an assemble of the upper silicon chip, the electrical insulative material layer and the lower silicon chip is properly covered with a cap, it is recommendable that the upper silicon chip is dimensioned to have a length less than that of the electrical insulative material layer, the electrical insulative material layer is dimensioned to have a length less than that of the lower silicon chip, and the lower silicon chip is dimensioned to have a length less than that of the base board.

Other objects, features and advantages of the present invention will become apparent from reading of the following description which has been made in conjunction with the accompanying drawings.

BRIEF DESCRIPTION OF THE DRAWINGS

The present invention is illustrated in the following drawings in which.

DESCRIPTION OF THE PREFERRED EMBODIMENT

The present invention will now be described in detail hereinafter with reference to the accompanying drawings which illustrate a preferred embodiment thereof.

Figure 1:
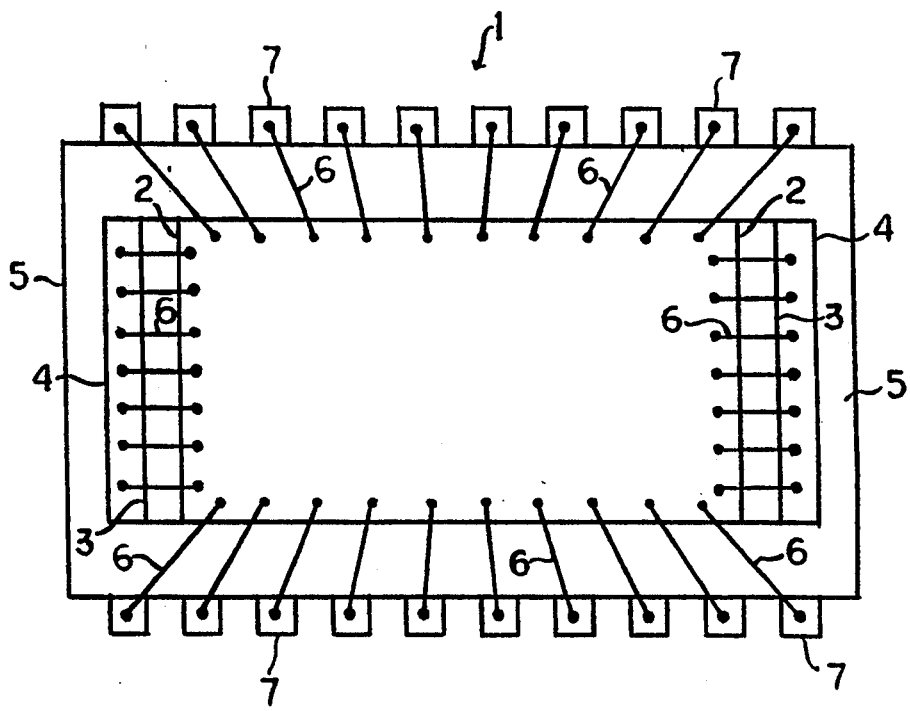
FIG. 1 is a plan view of a semiconductor integrated circuit constructed according to an embodiment of the present invention wherein a cap is removed from the semiconductor circuit for the purpose of simplification of illustration.
Figure 2:
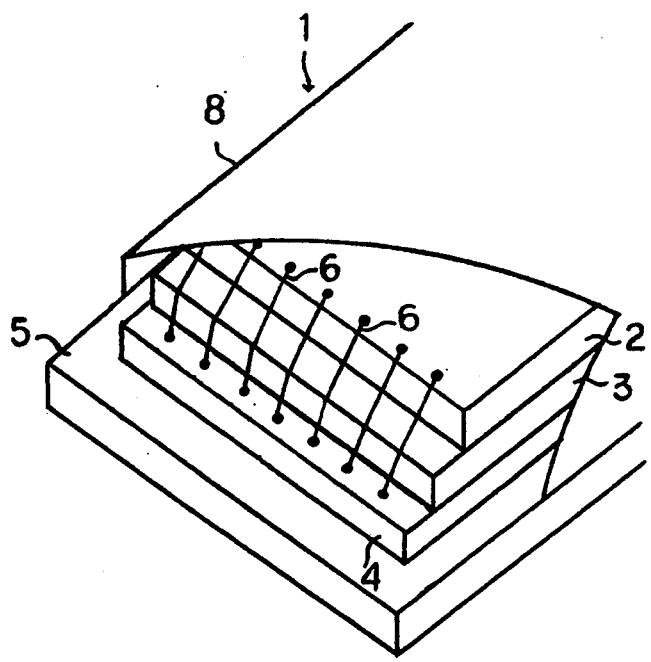
FIG. 2 is a partially exploded perspective view of the semiconductor integrated circuit shown in FIG. 1.
Figure 3:
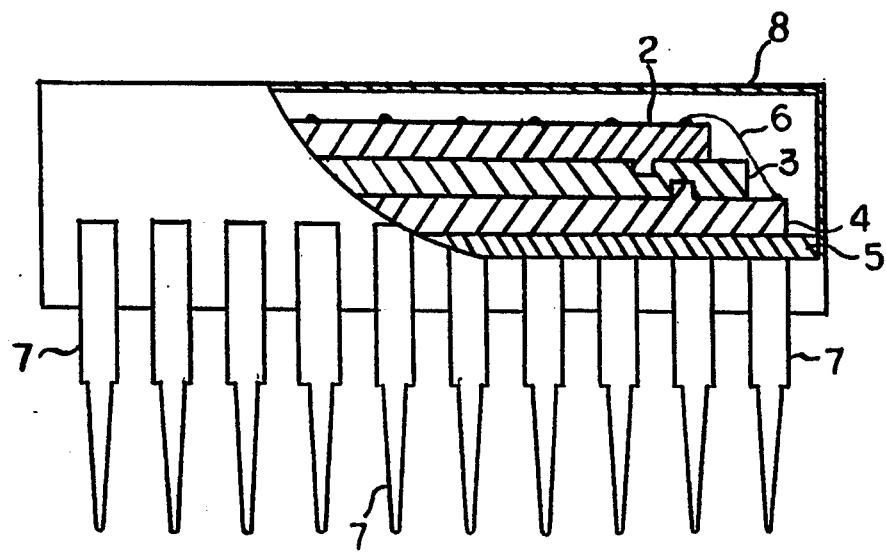
FIG. 3 is a partially exploded vertical sectional view of the semiconductor integrated circuit shown in FIG. 1.

As is best seen in FIG. 3, according to the embodiment of the present invention, a semiconductor integrated circuit 1 is constructed such that a lower silicon chip 4 is fixedly placed on a base board 5, a layer of electrical insulative material 3 is fixedly placed on the lower silicon chip 4, and an upper silicon chip 2 is fixedly placed on the electrical insulative material layer 3. The upper silicon chip 2 and the lower silicon chip 4 are electrically connected to each other via a number of lead wires 6 extending therebetween, and moreover, the upper silicon chip 2 and a number of bonding pads 7 are electrically connected to each other also via the lead wires 6 which are electrically connected to the bonding pads 7. The upper silicon chip 2 is dimensioned to have a length appreciably less than that the electrical insulative material layer 3, and moreover, the electrical insulative material layer 3 is dimensioned to have a length appreciably less than that of the lower silicon chip 4. After the upper silicon chip 2 and the lower silicon chip 4 are connected to each other via the lead wires 6, and the upper silicon chip 2 and the bonding pads 7 are connected to each other also via the lead wires 6 in that way, an assembly of the upper silicon chip 2, the electrical insulative material layer 3 and the lower silicon chip 4 is covered with cap 8.

The electrical insulative material layer 3 interposed between the upper silicon chip 2 and the lower silicon chip 4 is usually molded of a synthetic resin. However, the present invention should not be limited only to the synthetic resin. Alternatively, any other type of material rather than the synthetic resin may be employed as a raw material for the electrical insulative material layer 4, provided that it is proven that it can practically be used as an electrical insulative material for the semiconductor integrated circuit of the present invention.

Figure 4:
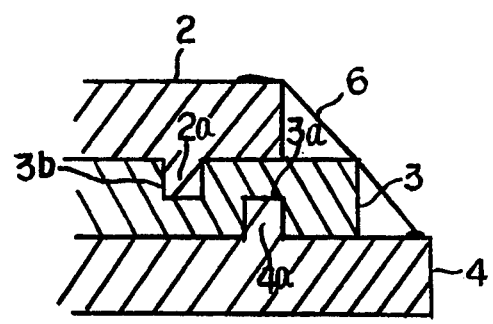
FIG. 4 is a fragmentary enlarged vertical sectional view of the semiconductor integrated circuit shown in FIG. 1.

As shown in FIG. 4, a projection 2a having a rectangular sectional shape is formed on the upper silicon chip 2 while projecting downward of the lower surface of the upper silicon chip 2, and a fitting groove 3b having the same sectional shape as that of the projection 2a and adapted to receive the projection 2a therein is recessed from the upper surface of the electrical insulative material layer 2. Once the projection 2a is fitted into the fitting groove 3b, there does not arise a malfunction that the upper silicon chip 2 placed on the electrical insulative material layer 3 is dislocated from the electrical insulative material layer 3. Similarly, a fitting groove 3a having a rectangular sectional shape is recessed from the rear surface of the electrical insulative material layer 4 and a projection 4a having the same sectional shape as that the fitting groove 3a and adapted to be fitted into the fitting groove 3a is formed on the upper surface of the lower silicon chip 4. Thus, once the projection 4a is fitted into the fitting groove 3a, there does not arise a malfunction that the lower silicon chip 4 is dislocated from the electrical insulative material layer 3. Consequently, the upper silicon chip 2, the electrical insulative material layer 3 and the lower silicon chip 4 are not undesirably dislocated from their original positions no matter how they vibrate.

While the present invention has been described above only with respect to a single preferred embodiment thereof, it should of course be understood that the present invention should not be limited only to this embodiment but various change or modification may be made without departure from the scope of the present invention as defined by the appended claims.

What is claimed is:

1. A semiconductor integrated circuit of the laminated type, comprising:
   an upper silicon chip;
   a lower silicon chip;
   a layer of electrical insulative material interposed between said upper silicon chip and said lower silicon chip, wherein said upper silicon chip and said lower silicon chip are electrically connected to each other via a number of lead wires extending therebetween, wherein a lower surface of said upper silicon chip includes at least one first projection having a predetermined sectional shape projected downward, and an upper surface of said electrical insulative material layer includes a first fitting groove having the same sectional shape as that of said first projection and adapted to receive said first projection therein, and wherein an upper surface of said lower silicon chip includes at least one second projection having a predetermined sectional shape projected upward, and a lower surface of said electrical insulative material layer includes a second fitting groove having the same sectional shape as that of said second projection and adapted to receive said second projection therein, wherein connections between said first projection and said first fitting groove, and between said second projection and said second fitting groove are non-conductive.

2. The semiconductor integrated circuit according to claim 1, wherein an assembly of said upper silicon chip, said electrical insulative material layer and said lower silicon tip is fixedly mounted on a base board, and said assembly is covered with a cap.

3. The semiconductor integrated circuit according to claim 1, wherein said upper silicon chip is electrically connected to a a plurality of bonding pads which are electrically connected to said lead wires.

4. The semiconductor integrated circuit according to claim 1, wherein said upper silicon chip is dimensioned to have a length less than that of said electrical insulative material layer, said electrical insulative material layer is dimensioned to have a length less than that of said lower silicon chip, and said lower silicon chip is dimensioned to have a length less than that of a base board.

5. A semiconductor integrated circuit of the laminated type, comprising:
   an upper silicon chip;
   a lower silicon chip;
   a layer of electrical insulative material interposed between said upper silicon chip and said lower silicon chip, wherein said upper silicon chip and said lower silicon chip are electrically connected to each other via a number of lead wires extending therebetween, wherein a lower surface of said upper silicon chip includes at least one of first fitting groove having a predetermined sectional shape, and an upper surface of said electrical insulative material layer includes a first projection projected upward having the same sectional shape as that of said first fitting groove and adapted to be fitted into said first fitting groove, and wherein an upper surface of said lower silicon chip includes at least one second fitting groove having a predetermined sectional shape, and a lower surface of said electrical insulative material layer includes a second projection projected downward having the same sectional shape as that of said second fitting groove and adapted to be fitted into said second fitting groove, wherein connections between said first projection and said first fitting groove, and between said second projection and said second fitting groove are non-conductive.

* * * * *